US009281104B2

(12) United States Patent
Sun

(10) Patent No.: US 9,281,104 B2
(45) Date of Patent: Mar. 8, 2016

(54) CONDUCTIVE THIN FILM COMPRISING SILICON-CARBON COMPOSITE AS PRINTABLE THERMISTORS

(71) Applicant: Nano and Advanced Materials Institute Limited, Hong Kong (CN)

(72) Inventor: Caiming Sun, Hong Kong (CN)

(73) Assignee: Nano and Advanced Materials Institute Limited, Hong Kong (CN)

( * ) Notice: Subject to any disclaimer, the term of this patent is extended or adjusted under 35 U.S.C. 154(b) by 0 days.

(21) Appl. No.: 14/451,444

(22) Filed: Aug. 5, 2014

(65) Prior Publication Data

US 2015/0262738 A1 Sep. 17, 2015

Related U.S. Application Data

(60) Provisional application No. 61/967,124, filed on Mar. 11, 2014.

(51) Int. Cl.

*H01L 21/84* (2006.01)
*H01C 7/04* (2006.01)

(Continued)

(52) U.S. Cl.

CPC .................. *H01C 7/048* (2013.01); *H01C 1/14* (2013.01); *H01C 17/0652* (2013.01); *H01C 17/06586* (2013.01); *H01C 7/049* (2013.01); *H01C 17/06593* (2013.01)

(58) Field of Classification Search

USPC .......................................................... 438/149
See application file for complete search history.

(56) References Cited

U.S. PATENT DOCUMENTS

2012/0018551 A1 1/2012 Britton et al.
2013/0203201 A1 8/2013 Britton et al.

(Continued)

FOREIGN PATENT DOCUMENTS

CN 200910129973.4 11/2011
EP 2226618 9/2010

(Continued)

OTHER PUBLICATIONS

M.R. Scriba, et al., Electrically active, doped monocrystalline silicon nanoparticles produced by hot wire thermal catalytic pyrolysis, Thin Solid Films, 2011, 519: 4491-4494.

(Continued)

*Primary Examiner* — Asok K Sarkar
(74) *Attorney, Agent, or Firm* — Eagle IP Limited; Jacqueline C. Lui

(57) ABSTRACT

A method of fabricating a temperature sensing device based on printed silicon-carbon nanocomposite film is disclosed. This method includes high-crystal-quality Si nanoparticles (NPs) homogeneously mixed with carbon NPs and Si—C nanocomposites printed as negative temperature coefficient (NTC) thermistor. These mixtures of Si and C NPs are formulated into screen printing paste with acrylic polymer binder and ethylene glycol (EG) as solvent. This composite paste can be successfully printed on flexible substrates, such as paper or plastics, eventually making printable NTC thermistors quite low-cost. Si and carbon powders have size range of 10 nanometers to 100 micrometers and are mixed together with weight ratios of 100:1 to 10:1. More carbon content, higher conductivity of printed Si—C nanocomposite films keeping similar sensitivity of high-quality Si NPs. With homogeneous distribution of carbon particles in printed films, electrons can tunnel from silicon to carbon and high-conductivity carbon microclusters enhanced hopping process of electrons in printed nanocomposite film. The measured sensitivity 7.23%/° C. of printed Si—C nanocomposite NTC thermistor is approaching the reported value of 8.0-9.5%/° C. for intrinsic silicon bulk material near room temperature, with the quite low resistance of 10 kΩ-100 kΩ. This NTC thermistor is quite suitable for low-cost readout circuits and the integrated systems target to be disposable temperature sensors.

11 Claims, 13 Drawing Sheets

(51) Int. Cl.
*H01C 17/065* (2006.01)
*H01C 1/14* (2006.01)

(56) References Cited

U.S. PATENT DOCUMENTS

| | | | | |
|---|---|---|---|---|
| 2013/0264190 | A1 | 10/2013 | Ha et al. | |
| 2014/0199584 | A1 * | 7/2014 | Kondo et al. | 429/163 |

FOREIGN PATENT DOCUMENTS

| | | |
|---|---|---|
| EP | 2506269 | 10/2012 |
| JP | 09199306 | 7/1997 |
| WO | 2012/035494 | 3/2012 |
| WO | 2012035494 | 3/2012 |

OTHER PUBLICATIONS

E.A. Odo, et al., Structure and characterization of silicon nanoparticles produced using a vibratory disc mill, The African Review of Physics, 2012, 7(0007):45-56.

W.M. Bullis, et al., Temperature coefficient of resistivity of silicon and germanium near room temperature, Solid-State Electronics Pergamon Press, 1968, 11:639-646.

R. Lechner, et al., Electronic properties of doped silicon nanocrystal films, Journal of Applied Physics, 2008, 104, 053701.

J. Ryu, et al., Highly dense and nanograined NiMn2O4 negative temperature coefficient thermistor thick films fabricated by aerosol-deposition, Journal of the American Ceramic Society, 2009, 92(12): 3084-3087.

P Murugaraj, et al., Thermistor behaviour in a semiconducting polymer-nanoparticle composite film. 2006. Journal of Physics D: Applied Physics. 39:2072-2078.

* cited by examiner

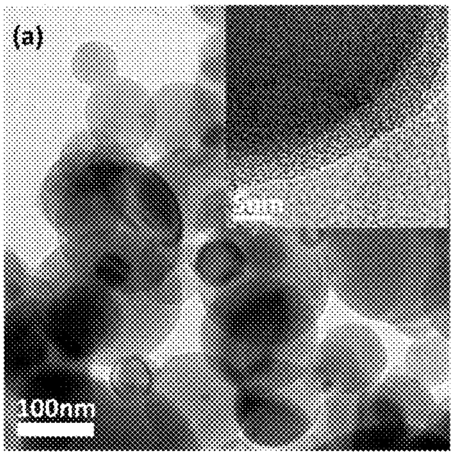
Fig. 1(a)
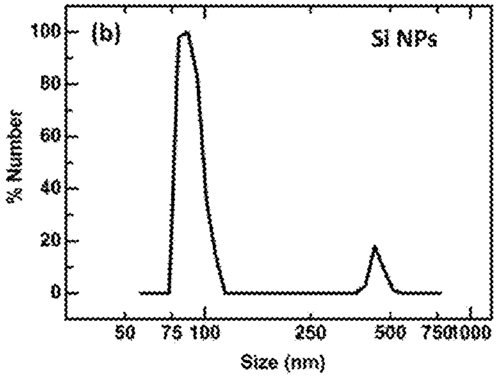
Fig. 1(b)
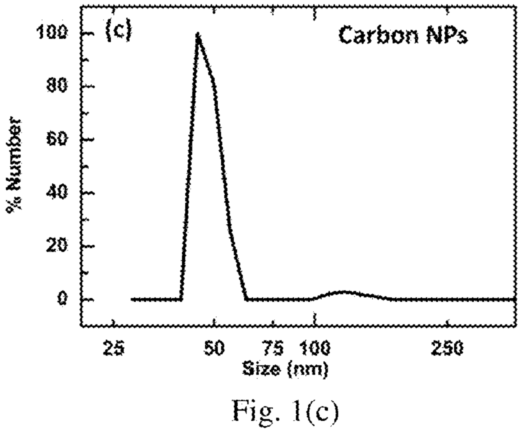
Fig. 1(c)
Fig.1

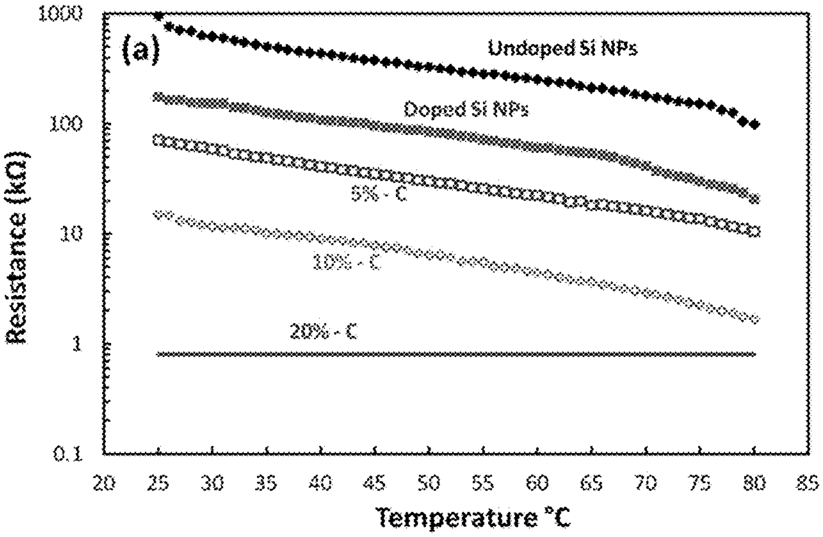
Fig. 3(a)
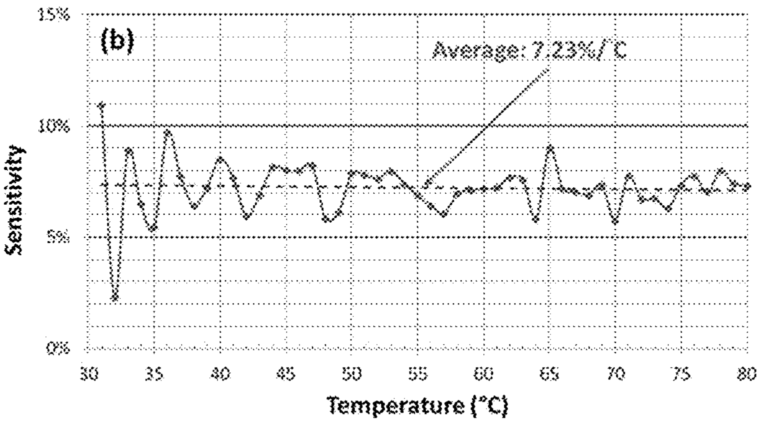
Fig. 3(b)
Fig.3

CONDUCTIVE THIN FILM COMPRISING SILICON-CARBON COMPOSITE AS PRINTABLE THERMISTORS

CROSS-REFERENCE TO RELATED APPLICATION

This application claims benefit under 35 U.S.C. §119(e) of U.S. Provisional Application having Ser. No. 61/967,124 filed on 11 Mar. 2014, which is hereby incorporated by reference herein in its entirety.

FIELD OF INVENTION

The present invention relates to a temperature sensing device. In particular the invention relates to a negative temperature coefficient (NTC) thermistor based on printed nanocomposite films.

BACKGROUND OF INVENTION

Thermistors, i.e. temperature sensitive resistors, are successfully used as temperature sensors relying on the large temperature dependence of the resistivity of the resistor. Traditionally, these devices are made of transition-metal oxide ($MnO_2$, CoO, NiO, etc.) with the process of ceramic technology (sintering of powders at high temperature, 900° C.). With the resistivity decreasing by increasing temperature (negative temperature coefficient, NTC), NTC thermistors show a wide range of opportunities in industrial and consumer applications, such as compensation of thermal effects in electronic circuits and thermal management in high-power electronic systems.

SUMMARY OF INVENTION

It is therefore an object of the present invention to provide a temperature sensitive conductive thin film and a method of producing the same. This invention is about the fabrication of screen printable thermistor based on composite silicon-carbon nanoparticles (NPs).

Accordingly, the present invention, in one aspect, provides a conductive thin film comprising a binder and a composite of silicon crystals and carbon particles, wherein the carbon particles are in the range of 1%-10% by weight percentage of said composite.

In an exemplary embodiment, the carbon particles are in the range of 5%-10% by weight percentage of the Si—C composite.

In another exemplary embodiment, the respective size of the silicon crystal and carbon particle is in the range of 1 nanometer to 100 micrometers, or 80-300 nanometers, or 50-200 nanometers, 40-60 nanometers.

In a further exemplary embodiment, the silicon crystals are selected from doped silicon or nondoped silicon, and the carbon particles are selected from the group consisting of carbon blacks, graphite flakes and graphene nanoplatelets.

In a further exemplary embodiment, the film is useful for producing a negative temperature coefficient thermistor.

In another aspect, the present invention provides a negative temperature coefficient thermistor. This thermistor contains a substrate with a conductive thin film disposed thereon and, at least a pair of electrodes contacting said thin film for connections with external electronic circuits.

In yet another aspect, the present invention provides a method of producing a conductive thin film. This method comprises the steps of a) mixing carbon particles with silicon crystals to obtain a Si—C composite; b) mixing said Si—C composite with a binder and a thinner to obtain a temperature sensitive ink; c) printing said ink on a substrate to form said conductive thin film. In this method, the carbon particles are in the range of 1%-10% by weight percentage of the Si—C composite.

Compared to traditional NTC by metal oxide, Si—C nanocomposites NTC shows many advantages of low cost, full printability, low fabrication temperatures and higher sensitivity.

BRIEF DESCRIPTION OF FIGURES

FIG. 1(*a*) shows TEM images of Si NPs; FIG. 1(*b*) shows particle size distribution of Si NPs dispersed into ethanol; FIG. 1(*c*) shows particle size distribution of Carbon NPs dispersed into ethanol.

FIG. 2(*b*) shows height image by AFM; FIG. 2(*c*) shows conductivity mapping by c-AFM.

FIG. 3(*a*) shows resistance versus temperature dependence for different carbon particles content; FIG. 3(*b*) shows typical sensitivity curve for printed Si—C nanocomposite sensors.

FIG. 4(*a*) shows isolated carbon particles, FIG. 4(*b*) shows incomplete C NPs network; and FIG. 4(*c*) shows complete percolation network of carbon particles.

DETAILED DESCRIPTION OF THE PREFERRED EMBODIMENTS

As used herein and in the claims, "comprising" means including the following elements but not excluding others.

Carbon particles refer to the either amorphous or crystalline carbon particles.

Analysis of Material

Si NPs are single-crystal, non-doped, and about 70 nm size. In FIG. 1(*a*), typical transmission electron microscopy (TEM) images show that particles are single-crystalline and having size range of 20 nm-100 nm and high-resolution TEM indicates that 3-4 nm surface oxide is surrounding the Si particle as inset of FIG. 1(*a*). This native surface oxidation can protect Si NPs from ambient moisture and oxygen and enhance their stability to some extent. The particle size distribution is also analyzed by laser scattering (Brookhaven Instruments 90Plus Nanoparticle Size Analyzer), as shown in FIG. 1(*b*) for Si NPs and FIG. 1(*c*) for C NPs. Most of Si NPs have size of around 80 nm and also a second mode of peak ~430 nm is found in FIG. 1(*b*) showing some nanoparticles aggregated together into larger clusters. Carbon NPs are in two-mode dispersions with main profile of 40-60 nm particle size as shown in FIG. 1(*c*).

Example 1

Preparation of Si—C Nanocomposite Printed Films

Figure 5:
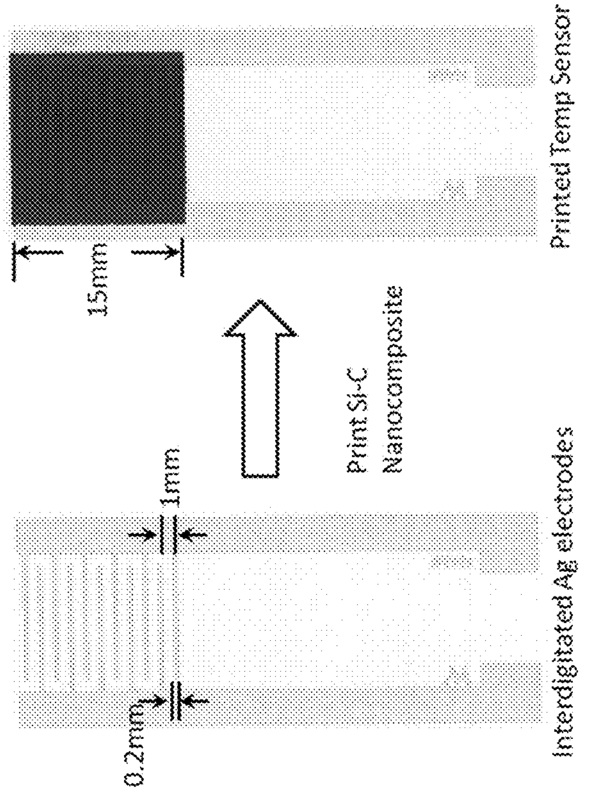
FIG. 5 shows photographs of interdigitated Ag electrodes and printed NTC thermistor.

About 1.3 g of commercial polymer binder, e.g. acrylic polymer binder was dissolved into 5.5 ml of ethylene glycol (EG). Then carbon NPs were added to silicon NPs so that 5 g Si—C nanocomposite powders contained 5% weight of carbon NPs. Eventually, the whole mixtures were homogenized in a planetary mixer (Thinky AR-100) for two minutes and a Si—C nanocomposite paste was obtained for screen printing. The temperature sensor is fabricated on flexible polyethylene terephthalate (PET) substrate. Two electrodes with distance of 1 mm were printed using DuPont 5064H silver conductor material and subsequently cured under ambient conditions. Afterwards, Si—C nanocomposite paste was printed with area of 15 mm×15 mm and made a continuous film covering above two Ag electrodes (as shown in FIG. 5). Finally, the device was thermally cured at 130° C. for 10 min to densify the Si—C nanocomposite layer and dry solvent in the device.

Figures 2, 2A, 2B, 2C:
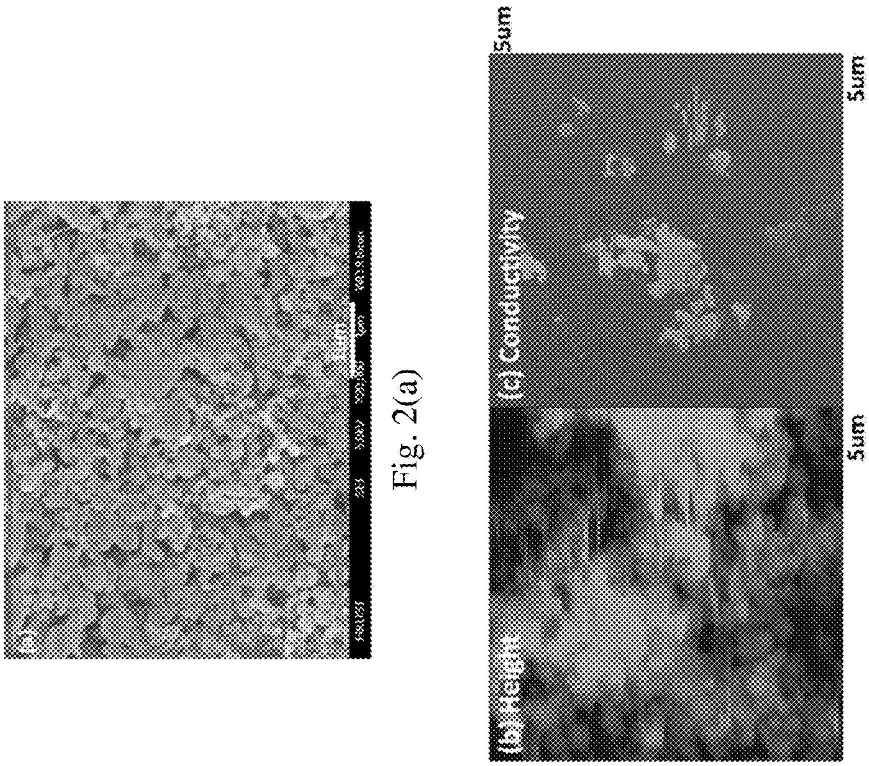
FIG. 2(*a*) shows SEM image of screen printed Si—C nanocomposite film.

Under the scanning electron microscopy (SEM), Si—C nanocomposite films were highly dense and no pores were observed in FIG. 2(*a*). The film thickness is about 5 um measured by surface profiler. Since morphologies of carbon NPs are quite similar with those of Si NPs, Carbon NPs cannot be identified from SEM images. In order to investigate carbon particle distribution in printed films, conductive atomic force microscopy (c-AFM) is utilized to map conductivity variations in terms of a current passing through a c-AFM tip which is moving for 5 um×5 um area on the surface of printed Si—C nanocomposite film. A bias of 12V is applied on the c-AFM tip to pass the current from tip to printed film. FIG. 2(*b*) shows height information during this contact mode AFM and FIG. 2(*c*) expresses conductivity mapping of this printed film in area of 5 um×5 um, corresponding to conductive carbon particles. This c-AFM mapping confirmed that the conducting carbon particles were homogeneously distributed in the Si NPs matrix without forming any conducting path chains. If conducting path chains were formed in the printed films, it would disable the temperature sensitive characteristics of NTC thermistor ('electrically short two separate Ag electrodes'). Therefore, achieving a homogeneous distribution of conducting particles, without the formation of the conduction paths which is formed at the lower limit of the percolation threshold, is the most important factor in this kind of nanocomposite material.

Example 2

Figures 4, 4A, 4B, 4C:
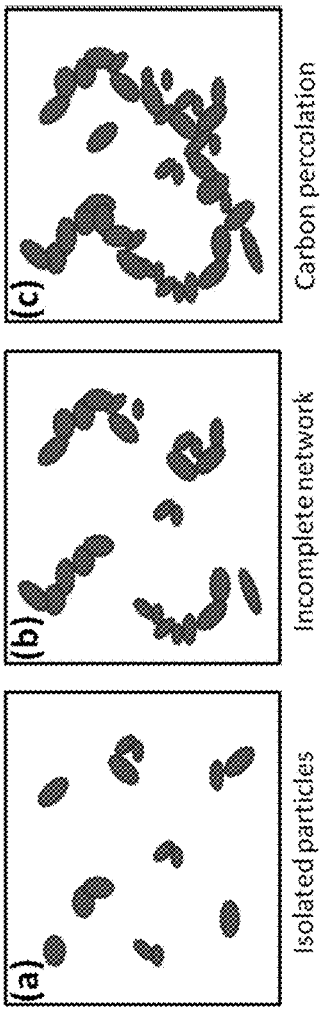
FIG. 4 shows schematical evolution for Si—C nanocomposite films as a function of carbon particle content.

Study on the Effect of Different Percentages of Carbon Particles on the Resistance of Si—C Nanocomposite Films With different percentages of carbon particles in these Si—C nanocomposite films, it can be observed NTC thermistor properties with different resistivity of printed films. The resistance R of printed films was investigated in terms of the temperature dependence and is plotted in FIG. 3(*a*). To determine its effect on the NTC characteristics, the carbon particle weight content was varied from 0 (pure Si NPs), 5%, 10% to 20%. Heavily-doped Si NPs synthesized from Si wafers by electrochemical etching and ultrasonic release, were also shown as a reference. The differentiations of these plots relate to the thermistor sensitivity, and the sensitivity is defined as (dR/dT)/R. FIG. 3(*b*) shows typical sensitivity curve with sensitivity >5%/° C. (averaged 7.23%/° C.). The resistance decreases significantly by two orders of magnitude with increasing carbon particle content, but the slope of plots did not change noticeably up to 10% carbon content. It is believed that the carbon particles were homogeneously dispersed in the NTC matrix and did not form the complete network of conducting path as shown in FIG. 2(*c*), thus the NTC property was not affected while the resistance was reduced by rule of mixture in the case of below 10% carbon content. However, when carbon particle contend reaches 20%, the nanocomposite film never shows any sensitivity to temperature changes, due to the completed percolation networks of carbon particles inside Si NPs matrix. Therefore, the composite film showed very low resistance without any NTC property. FIG. 4 shows the schematics of microstructural evolution for Si—C nanocomposite films as a function of carbon particle content. When small amount of carbon particles (less than 1% by weight percentage of the Si—C nanocomposite) are added into print paste, these C NPs are scarcely distributed in Si NPs matrix and they are isolated contribute little conductance in printed films, as shown in FIG. 4(*a*). With increasing content of carbon particles, C NPs aggregated together into microclusters surrounding silicon NPs domains closely, which corresponds 5%-10% weight content of carbon particles in Si—C nanocomposites as shown in FIG. 4(*b*). These incomplete networks of carbon clusters will significantly enhance the conductivity of Si—C nanocomposite films without affecting temperature sensitivity of Si NPs. However, when more carbon particles are mixed, above microstructural clusters will form complete conducting path in Si—C films as shown in FIG. 4(*c*). These carbon conducting paths will bypass all Si NPs and cannot show NTC property any more, corresponding to 20% carbon content in FIG. 3(*a*). In conclusion, no more than 10% carbon particles within the Si—C nanocomposite matrix can be very effective in lowering the resistance, while keeping the NTC properties away from the completely conductive percolation threshold limit.

Example 3

Figure 6:
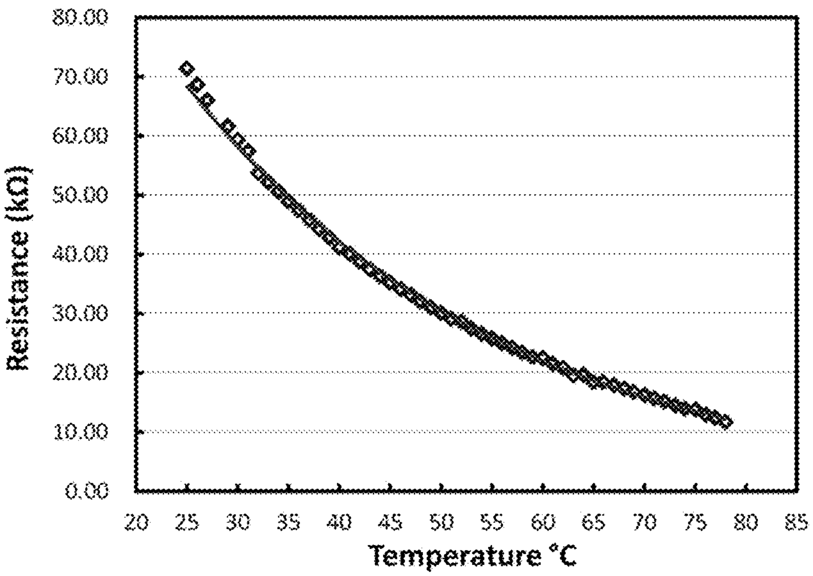
FIG. 6 shows NTC resistances versus temperature dependence for sample with Si—C nanocomposites, with solid line as exponential fitting.

A Method of Producing NTC Thermistor Using Nondoped Silicon Nanopowder and Carbon Blacks In a third example, a fully printable NTC thermistor was produced according to the design in FIG. 5. Two interdigitated silver electrodes were deposited on PET substrate by screen printing using DuPont 5064H silver conductor. Five pairs of fingers are prepared for Ag electrodes, with finger width of 0.2 mm and adjacent separation of 1 mm. Then, a square area of 15 mm×15 mm is defined for Si—C nanocomposite paste printing. The silicon nanoparticles used in this nanocomposite were nondoped silicon nanopowders from MTI Corporation, which had a particle size of 80 nm and single crystal nanostructures produced by plasma synthesis as shown in FIGS. 1(*a*) and (*b*). The carbon nanoparticles used in this nanocomposite were superconductive carbon blacks from TIMCAL Graphite & Carbon, which had particle size of 40-60 nm as shown in FIG. 1(*c*). About 5.5% carbon NPs were contained in Si—C nanocomposite and then formulated into screen printing paste with commercial polymer binder and EG solvents with solid loading ~80%. After printing Si—C nanocomposite paste, the whole device was thermally cured at 130° C. for 10 min. The resistance at 25° C. is 71.41 kΩ and FIG. 6 showed the resistance versus temperature dependence with sensitivity of 7.31%/° C.

Example 4

Figure 7:
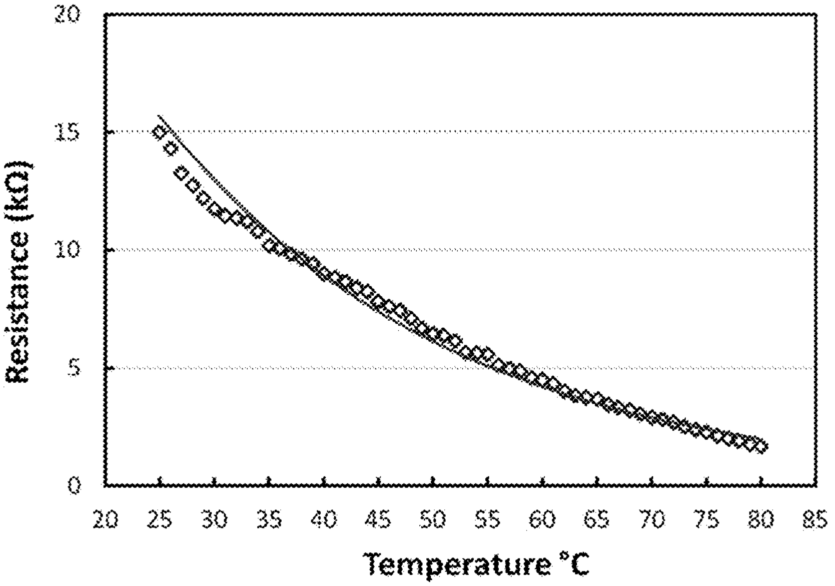
FIG. 7 shows NTC resistances versus temperature dependence for sample with mixtures of Si NPs and graphite flakes, and the solid line is exponential fitting of experimental data.
Figure 8:
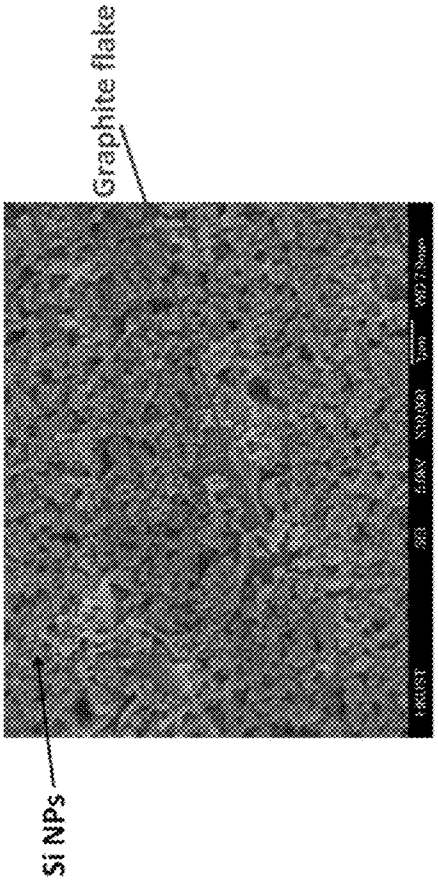
FIG. 8 shows SEM image of printed Si—C nanocomposite films with blend of Si NPs and graphite flakes.

A Method of Producing NTC Thermistor Using Nondoped Silicon Nanopowder and Graphite Flakes In a fourth example, a fully printable NTC thermistor was produced, also according to the design in FIG. 5. The Si—C composites were formed by mixing Si NPs and graphite flakes. The silicon nanoparticles were still nondoped silicon nanopowders from MTI Corporation, which had a particle size of 80 nm and single crystal nanostructures produced by plasma synthesis as shown in FIGS. 1(*a*) and (*b*). The graphite flakes were polar Graphene platelets from Angstron Materials Inc, with thickness of 10-20 nm and lateral size <14 um. About 10% graphite flakes were mixed in Si—C composites and then formulated into paste with commercial polymer binder and EG solvents with solid loading ~80%. After printing Si—C nanocomposite paste, the whole device was thermally cured at 130° C. for 10 min. The resistance at 25° C. is around 15 kΩ and FIG. 7 showed the resistance versus temperature dependence with sensitivity of 6.1%/° C. Separate graphite flakes were found in printed Si—C nanocomposite films under SEM images as shown FIG. 8.

Example 5

A Method of Producing NTC Thermistor Using Doped Silicon Wafer

Figure 9:
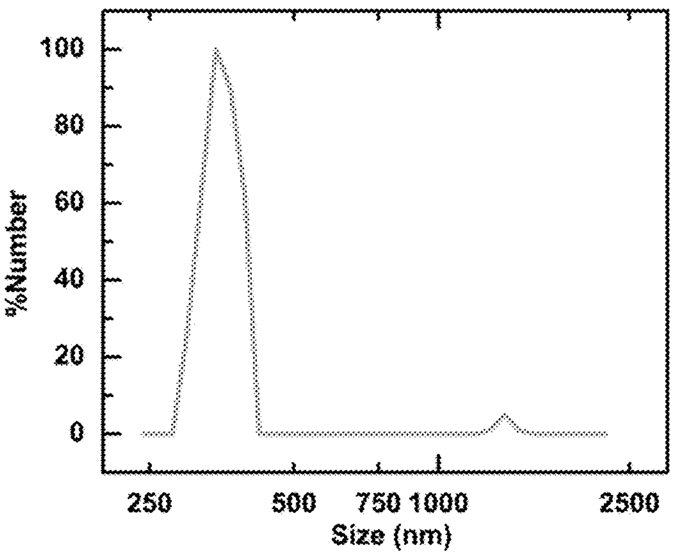
FIG. 9 shows particle size distribution of Si NPs synthesized by electrochemical etching method.
Figure 10:
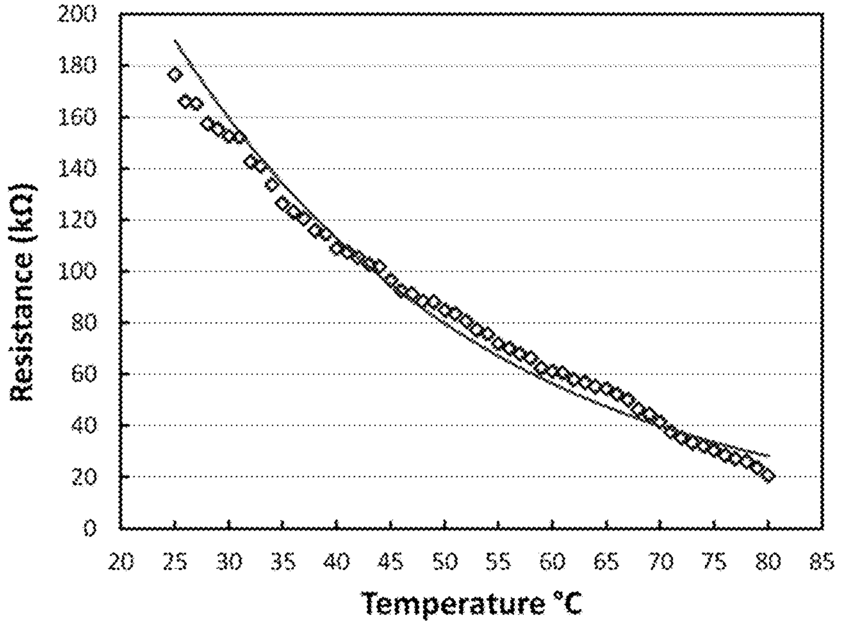
FIG. 10 shows resistances versus temperature dependence of printed thermistor based on heavily doped Si NPs from electrochemical etched Si wafers with the solid line as exponential fitting.

In a fifth example, a fully printable NTC thermistor was produced, also according to the design in FIG. 5. The silicon nanoparticles were synthesized by electrochemical etching of p-type heavily doped Si wafers with resistivity <0.005 Ω-cm. FIG. 9 showed the particle size distribution of these Si NPs with size of ~300 nm. The Si NPs were then formulated into paste with commercial polymer binder and EG solvents with solid loading ~80%. FIG. 10 expressed the resistance versus temperature dependence with sensitivity of 5.1%/° C. And the resistance at 25° C. is around 180 kΩ. Because these Si NPs come from high-crystal quality silicon wafers, the printed NTC using these heavily doped Si NPs also showed high sensitivity.

Example 6

Comparison on Resistivity of Different Paste Formula

Figure 11:
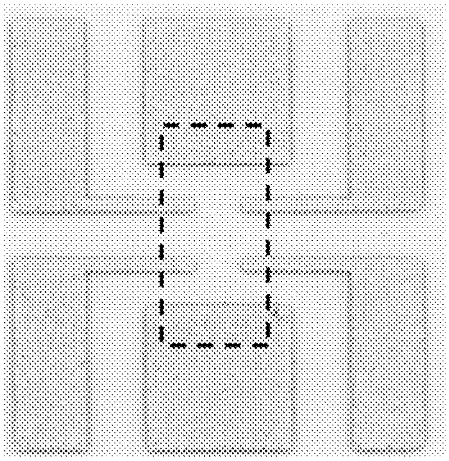
FIG. 11 shows photograph of printed Ag electrodes, and the dashed square shows the area for Si paste printing.

In a sixth example, a printed structure was produced for Hall measurement, according to the design in FIG. 11. The Si—C nanocomposite pastes were printed on dashed square area as shown in FIG. 11. The structure was thermally cured at 130° C. for 10 min to form a densified and uniform thin film. The resistivity and mobility were shown in below Table 1. The resistivity of silicon-carbon nanocomposite is one or two order of magnitude lower than non-doped Si NPs. The printed film from heavily doped Si NPs is relatively lower than undoped one but it is much higher than Si—C nanocomposite films.

TABLE 1

| Paste formula | Resistivity (Ω-cm) | Mobility ($cm^2$/V-s) |
|---|---|---|
| Pure undoped Si NPs | 29700 | 28.4 |
| Si NPs-Carbon NPs (5%) | 481 | 9.37 |
| Si NPs-Graphite flakes (10%) | 47.5 | 5.15 |
| Heavily doped Si NPs | 10900 | 15 |

Example 7

Study on Resistance of a Printed Temperature Sensor

Figure 12:
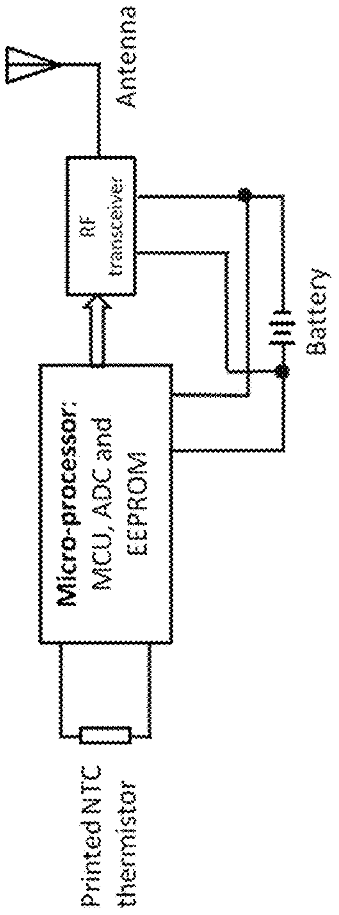
FIG. 12 shows schematic configuration for printed temperature sensor integrated with active RFID module.
Figure 13:
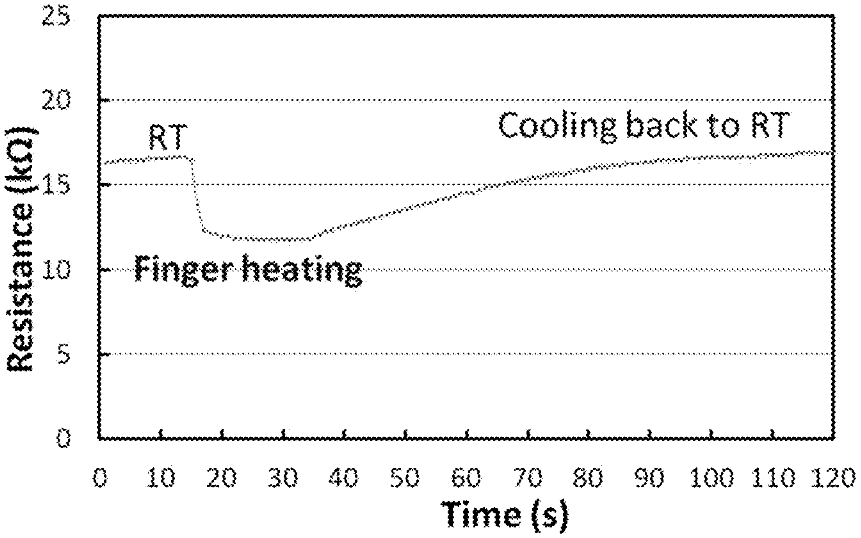
FIG. 13 shows data collection by RFID reader for printed temperature sensor integrated with active RFID tag.

In a seventh example, a printed temperature sensor was integrated with active RFID modules, according to the schematic design in FIG. 12. Printed temperature sensor was connected to analog-to-digital converter (ADC) and the on-board transceiver sent signals to RFID reader. The NTC thermistor was printed with 10% graphite flakes in Si NPs nanocomposite paste. As shown in FIG. 13, the resistance is 16.7 kΩ at room temperature. The reader recorded one data point of resistance in each second. When use hand fingers to heat the sensor to around 28° C. the resistance dropped to 11.8 kΩ within 2 seconds. From room temperature to 28° C., the sensor varied by almost 30% of its resistance. After the finger removed, the resistance returned to initial value at room temperature with slowly cooling.

In this invention, high-crystal-quality silicon NPs are mixed with highly conductive carbon NPs, and then an acrylic screen printing polymer binder is used to form Si—C nanocomposite paste. To meet the rheological requirements for screen printing, analytical grade ethylene glycol (EG) is used as a thinner. As a result, printed Si—C nanocomposite thermistors show very high temperature sensitivity close to intrinsic Si bulk material. And the resistance of these thermistors is reduced to 10-100 kΩ near room temperature, which is compulsory to integrate with low-cost readout circuits. This surprising phenomenon may benefit from high-crystal-quality Si NPs surrounded by highly conductive Carbon NPs. Electrons tended to tunnel from Si to C and then high conductivity of carbon materials enhanced electrical transport in printed Si—C nanocomposite films. The resulted resistivity of this Si—C nanocomposite film is smaller than 50 Ω-cm, which is much better than reported resistivity of Si NPs films, >10 kΩ-cm [Robert Lechner, et al, *J. Appl. Phys.* 104, 053701 (2008)].

The invention provides a method of forming an ink, the ink configured to form a highly conductive Si—C nanocomposite film. The method includes producing nanocomposites with Si NPs homogeneously mixed with carbon NPs. The method also includes formulate Si—C nanocomposites with acrylic polymer solutions resulting in a homogeneous Si NPs, C NPs and polymer blend. This means mixtures of Si/C NPs are homogeneously dispersed in polymer matrix and the rheology of these mixtures must meet requirements for screen printing inks.

Printed Si—C nanocomposite films in this invention show both high temperature sensitivity and high conductivity for mass production of NTC thermistors. Because the carbon nanoparticles are closely surrounding silicon, electrons can easily tunnel from silicon into carbon and carbon clusters enhance the hopping process in printed Si—C nanocomposite films. Not only can the method in this invention efficiently reduce the resistivity of printed Si NPs films, but also provide high temperature coefficients thermistors with quite high volume production and low cost in ambient environment.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

For example, the binder may include, but not limited to acrylic polymer, epoxy, silicone (polyorganosiloxanes), polyurethanes, polyimides, silanes, germanes, carboxylates, thiolates, alkoxies, alkanes, alkenes, alkynes, diketonates, etc. The thinner is selected from the group consisting of ethylene glycol, polyethylene glycol, hydrocarbons, alcohols, ethers, organic acids, esters, aromatics, amines, as well as water, and mixtures thereof etc. It is conventional for a skilled person to select different types of thinners to serve as a solvent for different binders to meet rheological requirements.

The weight of Si—C composite may account for 50-90% in the paste, preferably 60-90%, more preferably 80-90%.

A substrate on which the ink is printed to form conductive thin film is conventional in the art. For example, substrate may include, but not limited to polyethylene terephthalate, paper, plastics, fabric, glass, ceramics, concretes, wood, etc.

A conductive thin film refers to the conductive film having a thickness of 100 nanometer to 100 micrometers, preferably 1-100 micrometers, more preferably 5-10 micrometers.

An electrode refers to any electrical conductor, including electrodes, metallic contacts, etc.

Carbon particles may have high electrical conductivity, preferably at least 100 S/cm.

For the printing of Si—C composites, some types of printing methods can be used, such as offset printing, flexography, gravure printing, and screen printing. In particular for screen printing, mesh numbers of printing screens can be in range of 100-500. The best reproducibility is obtained for screens with mesh no. 200-300.

Unless defined otherwise, all technical and scientific terms used herein have the same meaning as commonly understood by one of ordinary skill in the art to which this invention belongs. Although any methods and materials similar or equivalent to those described herein can be used in the practice or testing of the invention, the preferred methods and materials are now described. All publications mentioned herein are incorporated herein by reference to describe and disclose specific information for which the reference was cited in connection with.

All references cited above and in the following description are incorporated by reference herein. The practice of the invention is exemplified in the following non-limiting examples. The scope of the invention is defined solely by the appended claims, which are in no way limited by the content or scope of the examples.

What is claimed is:

1. A negative temperature coefficient thin film thermistor, comprising:

a substrate;

a pair of electrodes on the substrate; and a thin film on the substrate, covering the pair of electrodes, and including a composite of silicon nanoparticles with a size less than 100 nanometers (nm) and carbon nanoparticles with a size less than 100 nm, wherein the carbon nanoparticles account for 5%-10% by weight of the composite, the carbon nanoparticles are formed as aggregated clusters around the silicon nanoparticles to enhance conductivity of the composite without forming complete conductive paths of carbon nanoparticles in order to maintain a negative temperature coefficient property of the composite.

2. The negative temperature coefficient thin film thermistor of claim 1, wherein the carbon nanoparticles have an electrical conductivity of at least 100 S/cm.

3. The negative temperature coefficient thin film thermistor of claim 1, wherein a respective size of the silicon nanoparticles and the carbon nanoparticles is 20 nm-100 nm, or 40-60 nanometers.

4. The negative temperature coefficient thin film thermistor of claim 1, wherein the silicon nanoparticles are selected from doped silicon or nondoped silicon, and the carbon nanoparticles are selected from the group consisting of carbon blacks, graphite flakes and graphene nanoplatelets.

5. The negative temperature coefficient thin film thermistor of claim 1 further comprising:

a binder, wherein the binder is selected from the group consisting of acrylic polymer, epoxy, silicone (polyorganosiloxanes), polyurethanes, polyimides, silanes, germanes, carboxylates, thiolates, alkoxies, alkanes, alkenes, alkynes and diketonates.

6. A method of producing a negative temperature coefficient thin film thermistor, comprising:

mixing silicon nanoparticles with a size less than 100 nanometers (nm) and carbon nanoparticles with a size less than 100 nm to obtain a homogenized Silicone-Carbon (Si—C) composite;

mixing the Si—C composite with a binder and a thinner to obtain a temperature sensitive ink; and printing the ink on a substrate with electrodes thereon to obtain the negative temperature coefficient thin film thermistor;

wherein the carbon nanoparticles account for 5%-10% by weight of the Si—C composite, and the carbon nanoparticles are formed as aggregated clusters around silicon nanoparticles to enhance conductivity of the Si—C composite without forming complete conductive paths of carbon nanoparticles and while maintaining the negative temperature coefficient property of the Si—C composite.

7. The method of claim 6 further comprising:

curing the thin film thermistor thermally to densify the Si—C composite and to dry the thinner.

8. The method of claim 6, wherein a respective size of the silicon nanoparticles and the carbon nanoparticles is 20 nm-100 nm or 40 nm-60 nm.

9. The method of claim 6, wherein the silicon nanoparticles are selected from doped silicon or nondoped silicon, and the carbon nanoparticles are selected from the group consisting of carbon blacks, graphite flakes and graphene nanoplatelets.

10. The method of claim 6, wherein the binder is selected from the group consisting of acrylic polymer, epoxy, silicone (polyorganosiloxanes), polyurethanes, polyimides, silanes, germanes, carboxylates, thiolates, alkoxies, alkanes, alkenes, alkynes and diketonates; and the thinner is selected from the group consisting of ethylene glycol, polyethylene glycol, hydrocarbons, alcohols, ethers, organic acids, esters, aromatics, amines, as well as water, and mixtures thereof.

11. A negative temperature coefficient thin film thermistor, comprising:

a substrate;

a thin film that includes a Silicon-Carbon (Si—C) composite of silicon nanoparticles with a size less than 100 nanometers (nm) and carbon nanoparticles with a size less than 100 nm; and a pair of electrodes on the substrate and contacting the thin film, the carbon nanoparticles account for 5%-10% by weight of the Si—C composite, and the carbon nanoparticles are formed as aggregated clusters around the silicon nanoparticles to enhance conductivity of the Si—C composite without affecting temperature sensitivity of the negative temperature coefficient thin film thermistor.

* * * * *